(12) United States Patent
Vobecky et al.

(10) Patent No.: US 8,415,239 B2
(45) Date of Patent: Apr. 9, 2013

(54) METHOD FOR MANUFACTURING A POWER SEMICONDUCTOR DEVICE

(75) Inventors: Jan Vobecky, Lenzburg (CH); Munaf Rahimo, Uezwil (CH)

(73) Assignee: ABB Technology AG, Zürich (CH)

( * ) Notice: Subject to any disclaimer, the term of this patent is extended or adjusted under 35 U.S.C. 154(b) by 407 days.

(21) Appl. No.: 12/731,977

(22) Filed: Mar. 25, 2010

(65) Prior Publication Data

US 2010/0248462 A1 Sep. 30, 2010

(30) Foreign Application Priority Data

Mar. 25, 2009 (EP) .................................. 09156116

(51) Int. Cl.
*H01L 21/22* (2006.01)
*H01L 21/225* (2006.01)
*H01L 21/265* (2006.01)

(52) U.S. Cl. ........ 438/543; 438/551; 438/558; 438/549; 257/E21.137; 257/E21.144; 257/E21.148

(58) Field of Classification Search .................. 438/542, 438/543, 535, 551, 558, 560; 257/E21.137, 257/E21.144, E21.146, E21.148, E21.15
See application file for complete search history.

(56) References Cited

U.S. PATENT DOCUMENTS

| 6,159,830 | A | 12/2000 | Galster et al. | |
| 6,358,825 | B1 * | 3/2002 | Hao et al. | 438/543 |
| 7,485,920 | B2 * | 2/2009 | Francis et al. | 257/328 |
| 2003/0057522 | A1 | 3/2003 | Francis et al. | |
| 2010/0248462 | A1 * | 9/2010 | Vobecky et al. | 438/530 |
| 2011/0108941 | A1 * | 5/2011 | Vobecky et al. | 257/477 |
| 2011/0108953 | A1 * | 5/2011 | Vobecky et al. | 257/607 |

FOREIGN PATENT DOCUMENTS

| DE | 40 26 797 A1 | 2/1992 |
| EP | 0 878 849 A2 | 11/1998 |
| EP | 0 978 868 A1 | 2/2000 |
| EP | 2 234 144 A1 * | 9/2010 |
| JP | 2011-101021 * | 5/2011 |

OTHER PUBLICATIONS

European Search Report dated Aug. 19, 2009.
Jan Vobecky et al., "Radiation-Enhanced Diffusion of Palladium for a Local Lifetime Control in Power Devices", IEEE Transactions on Electron Devices, vol. 54, No. 6, Jun. 2007, pp. 1521-1526.

(Continued)

*Primary Examiner* — Mary Wilczewski
(74) *Attorney, Agent, or Firm* — Buchanan Ingersoll & Rooney PC

(57) ABSTRACT

An exemplary method is disclosed for manufacturing a power semiconductor device which has a first electrical contact on a first main side and a second electrical contact on a second main side opposite the first main side and at least a two-layer structure with layers of different conductivity types, and includes providing an n-doped wafer and creating a surface layer of palladium particles on the first main side. The wafer is irradiated on the first main side with ions. Afterwards, the palladium particles are diffused into the wafer at a temperature of not more than 750° C., by which diffusion a first p-doped layer is created. Then, the first and second electrical contacts are created. At least the irradiation with ions is performed through a mask.

24 Claims, 4 Drawing Sheets

OTHER PUBLICATIONS

A. Tamba et al., "Characteristics of Bipolar Transistors With Various Depth N$^+$ Buried Layers Formed by High Energy Ion Implantation", Extended Abstract of the 20th (1988 International) Conference on Solid State Devices and Materials, Aug. 24-26, 1988, pp. 141-144, XP-000042517.

J. Vobeky et al., "Dynamic Avalanche in Diodes With Local Lifetime Control by Means of Palladium", Microelectronics Journal, vol. 39, 2008, pp. 878-883.

* cited by examiner

METHOD FOR MANUFACTURING A POWER SEMICONDUCTOR DEVICE

RELATED APPLICATIONS

This application claims priority under 35 U.S.C. §119 to European Patent Application No. 09156116.7 filed in Europe on Mar. 25, 2009, the entire content of which is hereby incorporated by reference in its entirety.

FIELD

The disclosure relates to the field of power electronics, for example, to a method for manufacturing a power semiconductor device.

BACKGROUND INFORMATION

The publication "Dynamic Avalanche in Diodes with Local Lifetime Control by Means of Palladium" (Microelectronics Journal 39, 878-883) describes a known diode, in which a homogeneous, continuous layer with Palladium and Palladium related defects can be introduced into the diode by radiation enhanced diffusion (RED) in order to convert the lightly doped n-base layer close to the anode junction of the diode to a lightly doped p-layer. Thereby, the breakdown voltage of the device can be improved because the peak electric field can be reduced. For the same reason, the dynamic avalanche during fast recovery can be postponed to higher voltages and more robust devices can be obtained. At the same time, the carrier lifetime may be decreased with a small increase of the leakage current. Such Palladium layers may only be applied as continuous layers over the whole plane of the diode. However, in many applications it may not be desired to have such a layer over the whole plane. For example, this may be the case of chip diodes with a planar junction termination in which this p-layer may not be present. In such cases it can be advantageous to include selectively processed p-layers only at the places where their effect may be beneficial. In general, this process can be advantages to any device with a blocking junction, in which increased avalanche ruggedness is needed.

Also the publication IEEE Transactions on Electron Devices, Vol. 54 (2007), 1521-1526 describes a method, in which a continuous Palladium layer can be created. In order to create the Pd layer, the anode side of a wafer can be sputtered with Palladium. Then, the anode side can be irradiated with alpha particles giving a defect peak in a depth of about 70 μm. Afterwards the device can be annealed at a temperature below 700° C. so that the Palladium particles diffuses into the wafer to the defect places.

Another application can be in compensation type devices, where the p-type columns coming from a surface or shallow p-type well into a certain depth of the silicon n-type wafer may be needed. The p-columns can be positioned in a way that they finally alternate n-type columns of a similar size. The n-columns are actually the remaining parts of the n-type substrate which are not changed to that of the p-type. This way, the spatial distribution of the electric field can be completely flat by virtue of the field compensation effect between the n- and p-columns and the breakdown voltage of a component can be high even for a relatively high doping level of the columns. Known methods of processing of such columns may be performed in several steps using rather complex processing.

In DE 40 26 797 A1, the creation of recombination centers is described. The charge carrier lifetime can be adjusted by creating defects by proton irradiation and then diffusing gold or Platinum onto a wafer. The particle irradiation can be performed through a mask, thereby creating a lateral profile. The diffusion in case of gold can be performed at 550 to 800° C. By the described method, the Platinum or gold particles are used to create defect centers. No doping is created by the diffused particles.

SUMMARY

An exemplary method for manufacturing a power semiconductor device, which includes a first electrical contact on a first main side and a second electrical contact on a second main side opposite the first main side and at least a two-layer structure with layers of different conductivity types, includes providing an n-doped wafer, creating a surface layer of palladium particles on the first main side of the n-doped wafer, irradiating the wafer on the first main side with ions diffusing the palladium particles into the wafer at a temperature of not more than 750° C., by which diffusion a first p-doped layer is created and creating the first and second electrical contacts. At least the irradiating with ions is performed through a mask.

BRIEF DESCRIPTION OF THE DRAWINGS

The subject matter of the disclosure will be explained in more detail in the following text with reference to the attached drawings, in which.

The reference symbols used in the figures and their meaning are summarized in the list of reference symbols. Generally, alike or alike-functioning parts are given the same reference symbols. The described embodiments are meant as examples and shall not confine the disclosure.

DETAILED DESCRIPTION

Figure 1A:
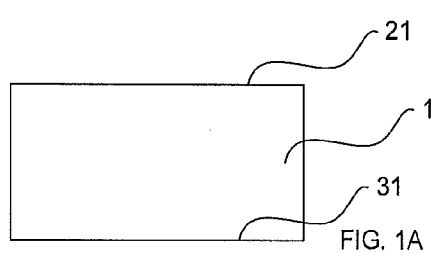
FIGS. 1-7 show different steps of exemplary methods for manufacturing a semiconductor device.

An exemplary method for manufacturing a semiconductor device includes buried low doped p-layers, which has at the same time lifetime control of excess carriers, both in locally terminated areas.

The exemplary method for manufacturing a power semiconductor device, having a first electrical contact on a first main side and a second electrical contact on a second main side opposite the first main side and at least a two-layer structure with layers of different conductivity types, includes providing: an n-doped wafer. A surface layer of Palladium particles is created on the first main side. The wafer is irradiated on the first main side with ions. Then the palladium particles are diffused (41) into the wafer at a temperature of not more than 750° C., by which diffusion (41) a first p-doped layer (7) is created. The step of the irradiation with ions can be performed through a mask. The Palladium particles are diffused into the wafer, and then the first and second electrical contacts can be created.

The radiation defects may be created in the wafer primarily in that depth of the wafer, in which the ions are stopped. By diffusion, the vacancy-related defect complexes from the irradiation can be replaced with the in-diffusing ions. Therefore, the diffusion should be performed at a temperature at which the ions can diffuse, but not so high that the defects may be repaired before the diffusing ions arrive.

By such an exemplary manufacturing method, a semiconductor device can be created, in which a buried p-doped layer can be arranged in a defined depth of the wafer, the depth being chosen according to the application needs, for example, beneath a p-doped base layer. As the depth of the created layer can be defined by the energy of implanted ions with a low mass, e.g., hydrogen or helium or high energy electrons, it can be higher than the depths which can be achieved by standard diffusion processes with high thermal budgets. For example, the diffusion of aluminium taking about 50 hours to reach the depth of 120 μm can be replaced by the hydrogen or helium irradiation with subsequent diffusion of the palladium no longer than 20 min and the diffusion of the aluminium can be limited below 30 hours.

Surprisingly, by using a masking process after a short diffusion time, the p-layer can be created only at a portion where the defects from the previous irradiation are present regardless of where the diffusion source at the surface was. In known diffusion processes at high temperatures, where masks are applied only at a surface, the doping ions diffuse below the mask opening into all three dimensions so the controllability can be limited.

For a properly chosen diffusion species the created defects convert the original n-type doping into that of the p-type and reduce the carrier lifetime without deteriorating the leakage current. This process can be self-limiting because the doping concentration saturates at a given relatively low irradiation dose. Therefore it can be suitable as a robust processing method. The masking of this process out of the regions for example, the junction termination, makes this method universal.

The created deep levels are incorporated into the substitutional sites of the silicon lattice and therefore have a high thermal stability. While the defects resulting from the standard hydrogen and helium irradiations typically anneal out already at 375° C., the defects from the exemplary method are stable up to 650° C. By this process additional back-end processes can be performed without the fear of losing the effect of lifetime reduction. While the defects from the standard hydrogen and helium irradiations partially anneal out already at 300° C., there can be a concern of changing the device parameters during operation. This can be addressed, if the exemplary method is used. Moreover, the exemplary method can be easily combined with the standard irradiation methods.

Figure 8:
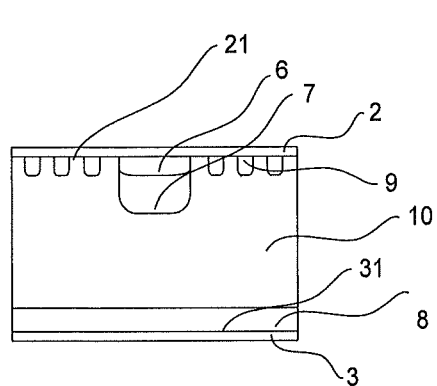
FIG. 8 shows an exemplary diode.

In FIG. 8, an exemplary power semiconductor device is shown. A diode is shown with a low n-doped base layer 10. The base layer 10 has a first main side 21 and a second main side 31, which can be arranged opposite the first main side 21.

In the case of such a diode, the second main side 31 is a cathode side, on which an n-doped cathode layer 8 is arranged. The cathode layer 8 has a higher doping than the base layer 10. On the cathode layer 8, on the side opposite the side on which the base layer 10 is arranged, a second electrical contact 3, which is the cathode electrode, is arranged. On the first main side 21, there is a second p-doped layer 6 arranged, which is typically limited in its lateral extensions, e.g. to an area defining the active zone of the diode and a surrounding junction termination 9. Between the p-doped second layer 6 and the n-doped base layer 10, there is a p-doped first layer 7 arranged. This first layer 7 can be limited in its lateral extensions. Typically, it can be limited to the same extensions as the second p-doped layer 6.

In the following, an exemplary manufacturing method is described. An n-doped wafer 1 is provided. The wafer 1 has a first main side 21 and a second main side 31 opposite the first main side 21. Typically, the wafer 1 can be a silicon wafer. Those parts of the wafer 1, which have in the finalized semiconductor device an unamended doping, form the base layer 10.

A surface layer 4, 4', 4", 4''' can be created on the first main side 21. The creation of the surface layer 4, 4', 4", 4''' can be done with fast diffusing elements (atoms). The term "fast diffusing" refers to atoms, which can be diffusible into the wafer at a temperature of not more than 750° C. Methods for creation of the surface layer 4, 4', 4", 4''' are well-known and can include, for example, evaporation, sputtering, spraying or implantation of particles. The particles for the creation of the surface layer 4, 4', 4", 4''' may be palladium. The thickness of the surface layer 4, 4', 4", 4''' can be preferably between 1 nm to 10 μm. The surface layer can be also thicker (up to 150 μm) and serve as a mask for irradiation.

The wafer 1 can be irradiated 5 on its first main side 21 with ions. The irradiation 5 can be performed with protons or helium ions or other light or inert gas ions. In the case of protons, the irradiation 5 can be performed preferably with a dose in the range between $1*10^{11}$ and $1*10^{14}$ cm$^{-2}$. If helium is used, the dose can be typically in the range between $1*10^{10}$ and $1*10^{13}$ cm$^{-2}$. With the increasing mass of the implanted ion the required irradiation dose decreases.

The ions are then diffused 41 into the wafer at a temperature of not more than 750° C. The temperature should be at least as high as the temperature at which the particles are diffusible into the wafer and capable of incorporating into the silicon matrix in the form of substitutional impurities and their defect complexes. In an exemplary embodiment, the diffusion 41 can be performed at a temperature between 400 and 700° C., in particular between 600 and 700° C., in particular between 600 and 650° C. At such low temperatures, diffusion outside the irradiated region 51 can be negligible.

The diffusion time is typically between 5 and 60 min. The diffusion time can depend on several factors like the material of the wafer 1, the particle sort of the surface layer 4, 4', 4", 4''', the depth, into which these particles are to be diffused and the diffusion temperature. The parameters of the created p-layer can also be adjusted by the cooling rate after the diffusion.

After the creation of the diffused layer, the first and second electrical contacts 2, 3 can be created.

In the exemplary process described above at least the irradiation 5 with ions can be performed through a single mask 45, while the masking of the surface layer 4, 4", 4''' can be optional. The mask 45 can be a mask that is laid on the wafer 1 on its first main side 21 without being attached to the wafer 1 like a stencil mask or shadow mask. It can also be an attached mask like a masked metal layer with a thickness according to the depth of the diffused layer. In the figures the mask 45 is shown with a distance to the wafer 1 to emphasize that it is a non-attached mask, but this is not meant as a limitation and any attached mask may be used instead.

Alternatively, the mask for irradiation can be also formed directly by the surface layer 4, 4", 4''' from which the fast diffusing atoms are subsequently diffused into the position of the radiation defects. The p-layer pattern is then negative to that of the mask.

In an exemplary embodiment, a wafer 1 is provided (FIG. 1A), which is first irradiated 5 through a mask 45 (FIG. 1B), which exemplarily covers the outer regions of the wafer 1.

Figure 1B:
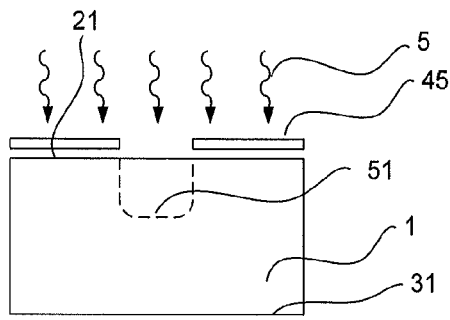
Figure 1C:
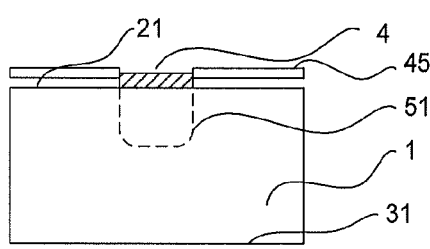

Then Palladium particles can be deposited or implanted through the mask 45 (FIG. 1C). In case of such a mask 45 being used for the irradiation 5, the same mask 45 can be used for the masked deposition of the layer surface 4 (as shown in FIG. 1C). Then the particles can be diffused into the wafer (FIG. 1D), resulting in a first layer 7, in which diffused particles are arranged in the irradiated area 51. The mask 45 is removed after the creation of the deposited layer 4 at any appropriate proceeding manufacturing step.

Figure 2A:
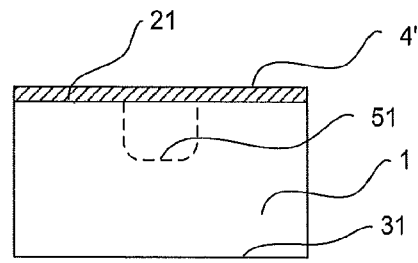
Figure 2B:
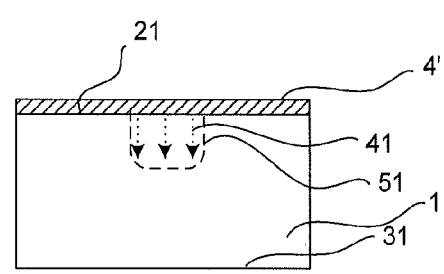

Alternatively to the mask used for the deposition of the layer 4, the mask 45 can also be removed directly after the masked irradiation 5 (FIG. 1B). Then a continuous surface layer 4' is created by deposition of the fast diffusing atoms on the whole first main side 21 (FIG. 2A). Afterwards, the particles can be diffused 41 into the wafer 1 (FIG. 2B), again resulting in a first layer 7, in which diffused particles are arranged in the irradiated area 51.

Figure 3A:
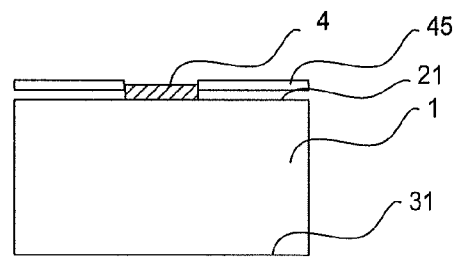
Figure 1D:
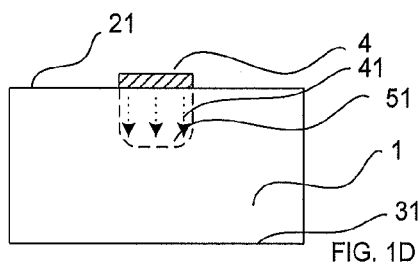
Figure 3B:
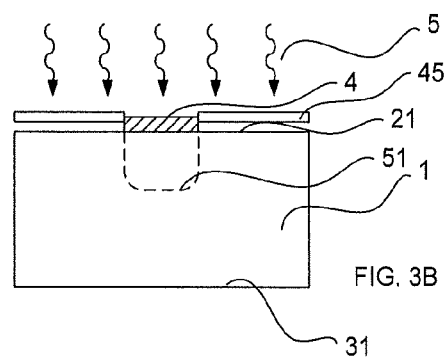

The steps of irradiation and deposition of the layer 4 can also be exchanged as shown in FIGS. 3A and 3B. A wafer is provided (FIG. 1A) and as shown in FIG. 3A, particles are implanted through a mask 45. Then the wafer can be irradiated on its first side 21 through a mask 45 (FIG. 3B). Afterwards, the particles can be diffused into the wafer 1, resulting in a first layer 7, as shown in FIG. 1D.

Figure 4A:
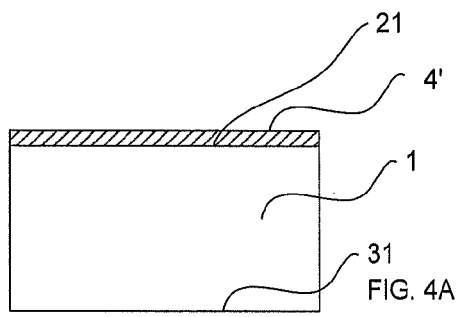
Figure 4B:
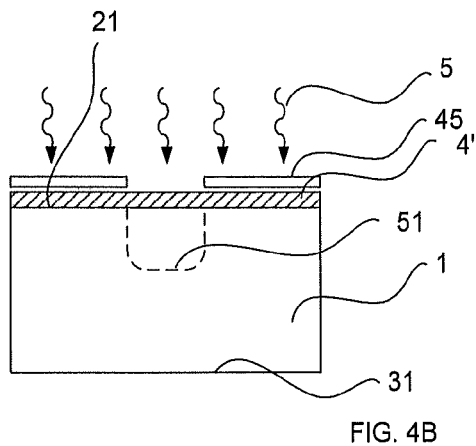
Figure 4C:
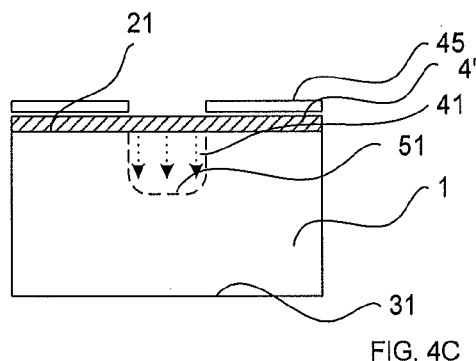

In yet a further exemplary embodiment, a continuous surface layer 4' is created by deposition or implantation of the fast diffusing particles on the whole first main side 21 (FIG. 4A). Afterwards, a mask 45 can be applied on the first main side 21 and the wafer 1 can be irradiated 5 (FIG. 4B), so that the irradiation particles only enter the wafer 1 in that part of the mask 45, in which the mask 45 has an opening. Afterwards, the particles can be diffused 41 into the wafer 1 (FIG. 4C), again resulting in a first layer 7, in which diffused particles are arranged in the laterally terminated irradiated area 51.

The surface layer 4, 4', 4", 4''' may be removed after the diffusion step and before the first electrical contact 2 is created. Alternatively, the surface layer 4, 4', 4", 4''' can be kept on the wafer 1 as part of the first electrical contact 2.

In case of irradiation 5 as well as the creation of a surface layer 4, 4", 4''' being performed through a mask, both manufacturing steps may be performed through the same mask, thereby limiting the irradiated area 51 to the same area as the area of the surface layer 4, 4", 4'''.

Of course, alternatively also different masks can be applied for the irradiation and the creation of the surface layer. Typically, but not necessarily, the surface layer 4, 4", 4'''; and the irradiated area 51 overlap. By the irradiation, defect places are created. Afterwards, the fast diffusing Palladium atoms are diffused 41 into the wafer 1 and take the place of the defects even if the defects are located sideways to the surface layer. In any case, a first p-doped layer 7 can be created, which first layer 7 is typically arranged in a depth up to 1-50 μm.

Figure 5A:
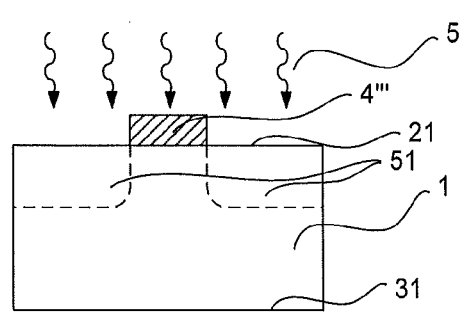

In yet a further exemplary embodiment, a surface layer 4''' is created by a masked deposition or implantation of particles as shown in the FIG. 3A. The surface layer has such a thickness that in the irradiation following afterwards (FIG. 5A), the radiation is absorbed in the surface layer 4''', but enters the wafer 1 outside the area of the surface layer 4'''. This creates irradiated areas 51, which adjoin the surface layer 4''', and do not overlap. In case of the surface layer 4''' used as a mask 45, its thickness can typically be up to 150 μm.

Figure 5B:
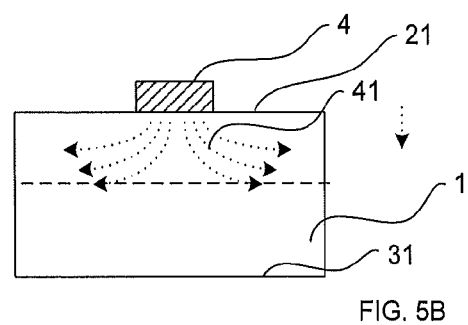

Afterwards, a diffusion step 41 can follow (FIG. 5B). Due to the usage of fast diffusing Palladium particles, the particles, only or at least mainly, diffuse to the places with radiation defects from the foregoing irradiation even if the particles have to diffuse sideways from the mask. Any fast diffusing particles, which allow creating a p-doping in the some depth of the wafer, could also be used for the creation of the first layer. Fast diffusing refers to the particles diffusing faster to the defect centers at the enhanced diffusion temperature than the defect centers are annealed out.

Figure 6A:
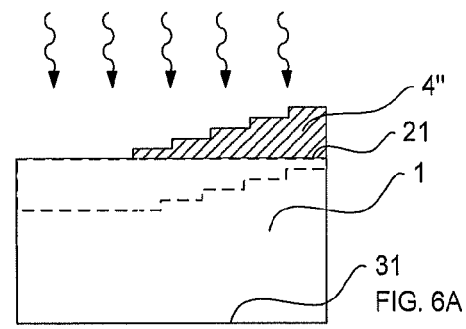
Figure 6B:
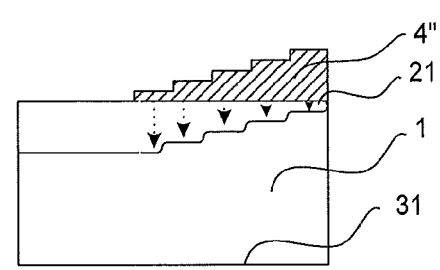
Figure 7A:
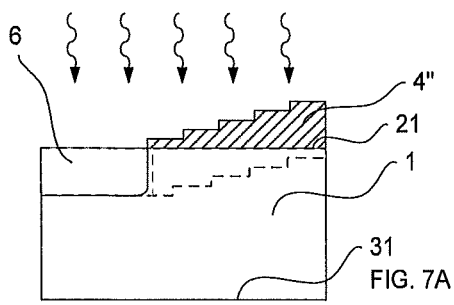
Figure 7B:
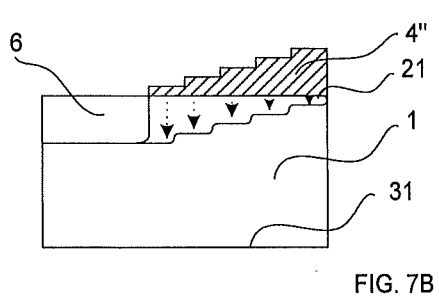
Figure 10:
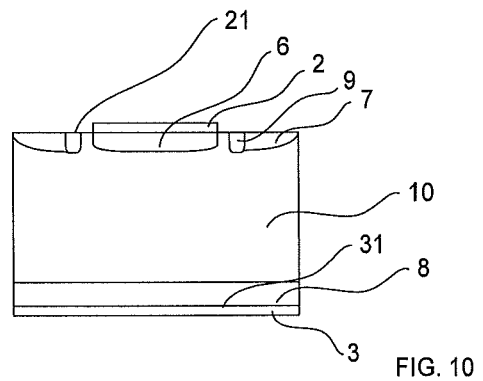
FIG. 10 shows an exemplary diode with a VLD junction termination.

The mask 45, or in the case of the surface layer 4" being used as a mask, the surface layer 4", may also be used to achieve a variable lateral doping (VLD), which for example can be usable as a junction termination. The thickness of the mask 45 (or surface layer 4''') varies, thereby influencing the radiation beam by partially lowering its energy and/or lowering its intensity so that the radiation is not completely stopped from entering the wafer 1 (FIGS. 6A, 7A). By the following exemplary diffusion, a first layer 7 can be created with laterally varying doping and/or depth of the layer (FIGS. 6B, 7B). A preferred design of the mask can be a staircase, but any other design may also be applied like a mask with continuously rising thickness. FIGS. 6A, 6B show exemplary manufacturing steps for an exemplary diode, the finalized device being shown in FIG. 10, and FIGS. 7A, B for an exemplary MOSFET.

In another exemplary embodiment, as shown in the device in FIG. 8, there is a second p-doped layer 6 created before the creation of the surface layer 4, 4', 4", 4''' and before irradiation 5. The second p-doped layer 6 can be created on the first main side 21 of the wafer 1, so that it can be arranged attaching its surface. Typically the second layer 6 can be created by surface deposition or implanting ions, which can then be diffused into the wafer 1 or by epitaxially growth. The first layer 7 can be created afterwards and diffused into such a depth that the first layer 7 can be arranged in the finalized device between the second layer 6 and the base layer 10. In case that the device includes a junction termination 9, this junction termination 9 is usually processed at the same time as the layer 6 with one mask in order to reduce manufacturing steps and to keep the number of masks used low. A benefit of the first layer 7 then is that the second layer 6 can be prolonged in a separate step in order to increase the avalanche ruggedness and kill the lifetime at the same time. In the case of such a semiconductor device having a first and a second p-doped layers, the first layer 7 can typically be arranged in a depth of 1-50 μm.

Figure 9:
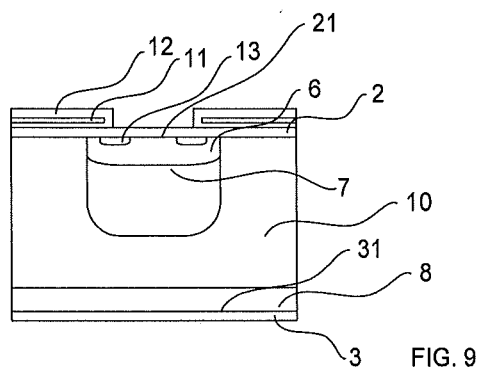
FIG. 9 shows an exemplary MOSFET.

FIG. 9 shows an exemplary MOSFET which can include on the first main side 21 a gate electrode 11, which can be electrically insulated from the base layer 10 by an electrically insulating layer 12. Source regions 13 of the first conductivity type can be arranged on the first main side 21 within the area of the second layer 6. The first layer 7 can be arranged between the second layer 6 and the base layer 10 in the region below the second layer 6.

Figure 11:
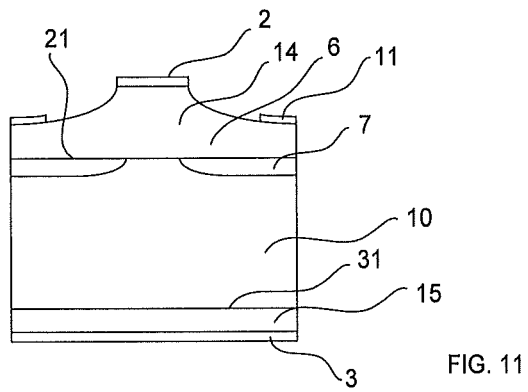
FIG. 11 shows an exemplary device like a GTO, GCT or IGCT.

FIG. 11 shows a device like an exemplary GTO, GCT or IGCT with a first layer 7. On the second main side of the base layer 10, there can be an anode layer 15 arranged, which can be in contact with the second electrical contact 3 functioning here as an anode. On the first main side 21, a continuous p-doped second layer 6 on the base layer 10, which again can be in contact to an n-doped cathode region 14 with a higher doping than the base layer 10. A first layer 7 can be arranged lateral to the first main contact 2 functioning as a cathode.

The exemplary methods can be applied on planar semiconductors as described above, but the exemplary methods can also be used for trench gate semiconductors.

The exemplary methods can also be applied to a plurality of semiconductor types like diodes, MOSFETs, IGBTs, thyristors, and gate commutated thyristors like GTOs, GCTs, IGCTs.

Figure 12:
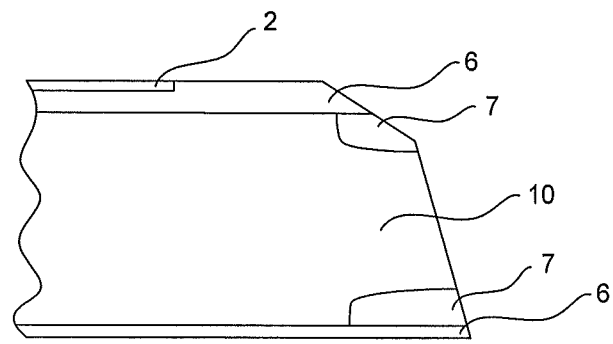
FIG. 12 shows an exemplary thyristor with a junction termination.
Figure 13:
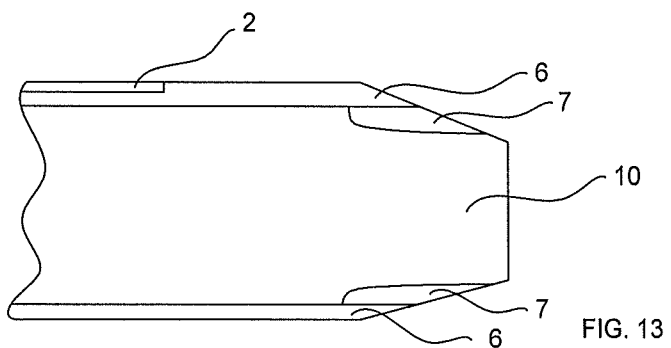
FIG. 13 shows an exemplary thyristor with another junction termination.

In FIG. 12 and FIG. 13, the junction termination of an exemplary thyristor, in particular a phase controlled thyristor, is shown, in which the first layer 7 can be present on the first as well as on the second main side 21, 31 of the device in the termination area. The figures differ in that the termination has different shapes. The first layer 7 on the second main side 31 can be created by any of the exemplary processes for the creation of a first layer 7 on the first main side 21.

Figure 14:
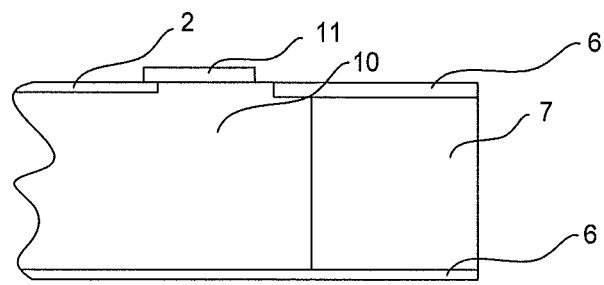
FIG. 14 shows an exemplary reverse conducting IGBT.

FIG. 14 shows an exemplary reverse conducting insulated gate bipolar transistor (RC-IGBT), in which the termination has a dicing surface.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST 1 wafer
10 base layer
11 gate
12 insulation layer
13 source region
14 cathode region
15 anode layer
2 first electrical contact
21 first main side
22 second main side
3 second electrical contact
31 second main side
4, 4' surface layer
41 diffusion
45 mask
5 irradiation
51 irradiated area
6 second layer
7 first layer
8 cathode layer
9 junction termination

What is claimed is:

1. A method for manufacturing a power semiconductor device, which comprises a first electrical contact on a first main side and a second electrical contact on a second main side opposite the first main side and at least a two-layer structure with layers of different conductivity types, the method comprising:
providing an n-doped wafer;
creating a surface layer of palladium particles on the first main side of the n-doped wafer;
irradiating the wafer on the first main side with ions;
after irradiating the wafer with ions, diffusing the palladium particles into the wafer at a temperature of not more than 750° C., by which diffusion a first p-doped layer is created; and
after diffusing the palladium particles, creating the first and second electrical contacts,
wherein during at least the irradiating step, the irradiation ions enter the wafer through an opening in a first mask, or at least one of radiation ion energy and intensity of the irradiation ions is lowered by at least one of the surface layer and the first mask.

2. The method according to claim 1, wherein parts of the wafer with doping form a base layer, the method comprising:
creating a second p-doped layer on the first main side before the creation of the surface layer and before irradiating; and
diffusing particles for the creation of the first layer into the wafer into a depth below the second p-doped layer.

3. The method according to claim 1, wherein the surface layer is created before the irradiating is performed.

4. The method according to claim 1, wherein the thickness of the surface layer is between 1 nm and 10 μm.

5. The method according to claim 1, wherein the irradiating step is performed with at least one of protons, helium ions, other inert gas ions and electrons.

6. The method according to claim 1, wherein the irradiating step is performed with protons and a dose in a range between $1*10_{11}$ and $1*10_{14}$ cm$^{-2}$.

7. The method according to claim 1, wherein the diffusing step is performed at least one of a temperature of at least 400° C., and with a diffusion time between 5 and 60 min.

8. The method according to claim 1, comprising at least one of: removing the surface layer after diffusion; and retaining the surface layer as part of the first electrical contact.

9. The method according to claim 1, wherein the semiconductor power device is one of a diode, transistor, thyristor and a MOSFET.

10. The method according to claim 1, wherein the surface layer is used as a second mask for the irradiating step.

11. The method according to claim 10, wherein the thickness of the surface layer is constant.

12. The method according to claim 1, wherein the first mask has a varying thickness.

13. The method according to claim 1, wherein first layers are created on the first main side and on the second main side.

14. The method according to claim 1, the irradiating step is performed before creation of the surface layer.

15. The method according to claim 1, wherein the irradiating step is performed with at least one of helium ions, and other insert gas ions, and with a dose in a range between $1*10^{10}$ and $1*10^{13}$ cm$^{-2}$.

16. The method according to claim 1, wherein the irradiating step is performed with electrons and a dose in a range between $1*10^{13}$ and $1*10^{17}$ cm$^{-2}$.

17. The method according to claim 1, wherein the diffusion step is performed at least one of a temperature of between 600 and 650° C., and with a diffusion time between 5 and 60 min.

18. The method according to claim 1, wherein the diffusion step is performed at least one of a temperature of between 600 and 700° C., and a diffusion time between 5 and 60 min.

19. The method according to claim 11, wherein the thickness of the surface layer is up to 150 μm.

20. The method according to claim 10, wherein the first mask has a varying thickness.

21. The method according to claim 5, wherein the surface layer is used as a second mask for the irradiating step.

22. The method according to claim 6, wherein the surface layer is used as a second mask for the irradiating step.

23. The method according to claim 15, wherein the surface layer is used as a second mask for the irradiating step.

24. The method according to claim 16, wherein the surface layer is used as a second mask for the irradiating step.

* * * * *